(12) United States Patent
Pauze et al.

(10) Patent No.: US 10,563,085 B2
(45) Date of Patent: *Feb. 18, 2020

(54) CHEMICAL VAPOR RESISTANT EPOXY COMPOSITION

(71) Applicant: Henkel IP & Holding GmbH, Duesseldorf (DE)

(72) Inventors: Robert H. Pauze, Middleboro, MA (US); Boris Krivopal, Brighton, MA (US); Timothy P. Walsh, Weymouth, MA (US)

(73) Assignee: Henkel IP & Holding GmbH, Duesseldorf (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/113,145

(22) Filed: Aug. 27, 2018

(65) Prior Publication Data

US 2018/0362797 A1 Dec. 20, 2018

Related U.S. Application Data

(60) Division of application No. 14/967,999, filed on Dec. 14, 2015, now Pat. No. 10,087,341, which is a division of application No. 13/713,164, filed on Dec. 13, 2012, now abandoned, which is a continuation of application No. PCT/US2011/052121, filed on Sep. 19, 2011.

(60) Provisional application No. 61/385,692, filed on Sep. 23, 2010.

(51) Int. Cl.
| | |
|---|---|
| *C09D 163/04* | (2006.01) |
| *C08K 5/17* | (2006.01) |
| *C08G 59/18* | (2006.01) |
| *C09J 163/00* | (2006.01) |
| *H05K 5/02* | (2006.01) |
| *C09D 5/00* | (2006.01) |
| *H05K 5/06* | (2006.01) |

(52) U.S. Cl.
CPC ......... *C09D 163/04* (2013.01); *C08G 59/184* (2013.01); *C08K 5/17* (2013.01); *C09D 5/00* (2013.01); *C09J 163/00* (2013.01); *H05K 5/02* (2013.01); *H05K 5/069* (2013.01)

(58) Field of Classification Search
CPC .................................................. C09D 163/04
See application file for complete search history.

(56) References Cited

U.S. PATENT DOCUMENTS

| | | | |
|---|---|---|---|
| 4,340,716 A | 7/1982 | Hata et al. | |
| 4,702,962 A | 10/1987 | Kojo et al. | |
| 5,084,532 A | 1/1992 | Schenkel | |
| 5,202,390 A | 4/1993 | Muelhaupt et al. | |
| 5,218,063 A | 6/1993 | Kimball | |
| 5,382,635 A | 1/1995 | Mcinnis et al. | |
| 5,506,283 A | 4/1996 | Mcinnis et al. | |
| 5,677,387 A | 10/1997 | Bayard et al. | |
| 5,686,534 A | 11/1997 | Bayard et al. | |
| 5,693,714 A | 12/1997 | Bauman et al. | |
| 5,886,112 A | 3/1999 | Vuillemin et al. | |
| 5,969,053 A | 10/1999 | Bauman et al. | |
| 6,015,865 A | 1/2000 | Blank et al. | |
| 6,286,373 B1 | 9/2001 | Lister et al. | |
| 6,451,876 B1 | 9/2002 | Koshy | |
| 6,776,869 B1 | 8/2004 | Schenkel | |
| 6,833,511 B2 | 12/2004 | Uchinono et al. | |
| 6,884,854 B2 | 4/2005 | Schoenfeld et al. | |
| 6,894,113 B2 | 5/2005 | Court et al. | |
| 6,913,798 B2 | 7/2005 | Kitamura et al. | |
| 6,998,011 B2 | 2/2006 | Schoenfeld et al. | |
| 2001/0055679 A1* | 12/2001 | Schumann | C09J 7/385 428/352 |
| 2002/0115736 A1 | 8/2002 | Koshy | |
| 2002/0117259 A1* | 8/2002 | Giroux | C08G 59/18 156/330 |
| 2003/0142033 A1 | 7/2003 | Pepperling et al. | |
| 2004/0156997 A1* | 8/2004 | Burkhart | B05D 5/12 427/402 |
| 2004/0181013 A1 | 9/2004 | Schenkel | |
| 2005/0070634 A1 | 3/2005 | Lutz et al. | |
| 2005/0129955 A1 | 6/2005 | Schoenfeld et al. | |
| 2005/0215730 A1 | 9/2005 | Schoenfeld | |
| 2006/0084727 A1* | 4/2006 | Yan | C08G 59/226 523/444 |
| 2006/0189736 A1* | 8/2006 | Mori | C08L 101/10 524/404 |
| 2007/0172596 A1* | 7/2007 | Hartman | C04B 41/009 427/386 |
| 2010/0006329 A1 | 1/2010 | Matsuno et al. | |
| 2010/0203249 A1 | 8/2010 | Elgimiabi | |
| 2011/0011533 A1 | 1/2011 | Golden et al. | |

FOREIGN PATENT DOCUMENTS

| | | |
|---|---|---|
| CN | 1356863 | 7/2002 |
| CN | 1388818 | 1/2003 |
| CN | 1763946 | 4/2006 |
| EP | 0044816 | 1/1982 |
| EP | 0249183 | 12/1987 |
| EP | 0342035 A2 | 11/1989 |
| JP | 58063758 | 4/1983 |
| JP | 58069265 | 4/1983 |
| JP | 2005179516 | 7/2005 |
| JP | 2008184598 | 8/2008 |

OTHER PUBLICATIONS

International Search Report in connection with International Patent Application No. PCT/US2011/052121 dated Apr. 27, 2012.

* cited by examiner

*Primary Examiner* — Megan McCulley
(74) *Attorney, Agent, or Firm* — James E. Piotrowski

(57) ABSTRACT

A two part, curable, epoxy composition useful for potting or sealing electrical devices for use in hazardous locations. Cured reaction products of the epoxy composition meet most or all UL 674 requirements and are useful to seal apertures in electrical equipment. Equipment sealed with the disclosed compositions can meet the UL 674 requirement.

15 Claims, No Drawings

CHEMICAL VAPOR RESISTANT EPOXY COMPOSITION

This application claims the benefit of U.S. patent application Ser. No. 14/967,999 filed Dec. 14, 2015 which is a divisional of U.S. patent application Ser. No. 13/713,164 filed Dec. 13, 2012 which is a continuation of International PCT Patent Application No. PCT/US2011/052121 filed Sep. 19, 2011 and published on Mar. 29, 2012 as WO 2012/040094, which claims the benefit of U.S. Provisional Patent Application No. 61/385,692 filed Sep. 23, 2010, the contents of each of which are incorporated herein by reference in their entirety.

FIELD

The present disclosure relates generally to a two part, curable, epoxy composition useful for potting or sealing electrical devices for use in hazardous locations.

BACKGROUND

Some applications require the use of electrical equipment in hazardous locations where exposure to chemical, flammable and/or combustible conditions is likely. Electrical equipment used in such hazardous locations requires construction to, and compliance with, exacting standards to lessen the chance of electrical equipment malfunction and failure.

Underwriters Laboratories Inc. (UL) is an independent product safety certification organization that has been testing products and writing safety standards for over a century. Underwriters Laboratories, Inc has written safety standard UL 674 "Standard for Electric Motors and Generators for Use in Division 1 Hazardous (Classified) Locations". Electrical equipment such as motors, generators, panels, raceways and junctions used under hazardous conditions can be constructed in accordance to the UL 674 standard. Equipment used in such conditions typically must be approved under this standard. Approval under a UL standard can require testing of the system and/or system components to ensure compliance with that UL standard.

One part of the UL 674 standard requires that openings in electrical equipment be potted or sealed with an approved material that can meet specific performance criteria for resistance to chemicals. These criteria are specified in UL standard 674, section 45. UL standard 1203, "Tests On Sealing Materials", is similar to UL 674, section 45. This standard specifies resistance to damage and degradation of a sealant material after exposure to vapors from a number of specified chemicals. Approved sealant materials must retain at least 85% of their compressive strength after 168 hours exposure to saturated vapors in air of each of the specified chemicals and must not shrink, swell, crack or lose or gain more than 1 percent of their weight.

Most epoxy compositions will degrade substantially when exposed to one or more of the test chemical vapors and therefore can not meet the chemical resistance requirements of UL 674. Retention of at least 85% compression strength after exposure to glacial acetic acid is especially difficult for most epoxy compositions.

There are very few materials alleged to be approved for use under the UL 674 standard. One material is CHICO available from Crouse Hinds Cooper. CHICO is an inorganic cementitious material that is mixed with water and poured into a fitting or aperture to form a seal. More recently, CHICO SPEEDSEAL available from Crouse Hinds Cooper has been approved. CHICO SPEEDSEAL is believed to be polyurethane that expands during curing to form a seal in a fitting or aperture. Other useful sealants are KNEADASEAL and KNEADASEAL SL available from Polymeric Systems, Inc. of Pennsylvania, USA. KNEADASEAL is a solid epoxy putty stick that is kneaded between a user's fingers to mix and subsequently forced into a fitting or aperture to form a seal that subsequently cures. Forcing the dense, solid putty into a small aperture to form a seal is difficult, especially if wires penetrate the aperture. KNEADASEAL SL is a pourable epoxy compound. Technical literature notes that KNEADASEAL SL contains bisphenol A epoxy resins.

SUMMARY

Briefly, one aspect of the disclosure provides a two part epoxy composition comprising an epoxy resin component and a curing agent component. The epoxy resin component advantageously comprises a novolac resin, a diglycidyl ether of bisphenol F resin or a combination thereof. The curing agent component advantageously comprises an amine, an amine functional adduct of an amine and an epoxy resin, or a combination thereof. In an advantageous variation the curing agent component comprises an aliphatic or cycloaliphatic amine, an amine functional adduct of ethylene diamine and an epoxy resin, or a combination thereof. The epoxy composition can optionally include one or more composition additives in the epoxy resin component or the curing agent component.

In one embodiment the epoxy resin component consists essentially of a novolac resin, a diglycidyl ether of bisphenol F resin or a combination thereof. As used herein an epoxy component that consists essentially of a novolac resin, a diglycidyl ether of bisphenol F resin or a combination thereof does not include epoxy resins other than a novolac resin or a diglycidyl ether of bisphenol F resin but may include other non-epoxy resin components.

In one embodiment the curing agent component consists essentially of an aliphatic or cycloaliphatic amine, an amine functional adduct of bisphenol F, or a combination thereof. As used herein a curing agent component consists essentially of an aliphatic or cycloaliphatic amine, an amine functional adduct of bisphenol F or a combination thereof does not include curatives other than curing agent component consists essentially of an aliphatic or cycloaliphatic amine, an amine functional adduct of ethylene diamine and an epoxy resin, or a combination thereof but may include other non-epoxy curative components.

The two components are stored separately and mixed in predefined proportions to form a mixed epoxy composition shortly before use. Curing of the mixed composition starts when the components are mixed and proceeds at room temperature.

The mixed epoxy composition can be disposed within an electrical housing aperture and will flow around projections in the aperture. Cured reaction products of the epoxy composition meet most or all UL 674 requirements and are useful to seal apertures in electrical equipment. Equipment sealed with the disclosed compositions can meet the UL 674 requirement.

The disclosed compounds include any and all isomers and stereoisomers. In general, unless otherwise explicitly stated the disclosed materials and processes may be alternately formulated to comprise, consist of, or consist essentially of, any appropriate components, moieties or steps herein disclosed. The disclosed materials and processes may additionally, or alternatively, be formulated so as to be devoid, or substantially free, of any components, materials, ingredients, adjuvants, moieties, species and steps used in the prior art compositions or that are otherwise not necessary to the achievement of the function and/or objective of the present disclosure.

When the word "about" is used herein it is meant that the amount or condition it modifies can vary some beyond the stated amount so long as the function and/or objective of the disclosure are realized. The skilled artisan understands that there is seldom time to fully explore the extent of any area and expects that the disclosed result might extend, at least somewhat, beyond one or more of the disclosed limits. Later, having the benefit of this disclosure and understanding the concept and embodiments disclosed herein, a person of ordinary skill can, without inventive effort, explore beyond the disclosed limits and, when embodiments are found to be without any unexpected characteristics, those embodiments are within the meaning of the term about as used herein.

DETAILED DESCRIPTION

The disclosed epoxy composition is a two part composition comprising an epoxy resin component and a separate curing agent component. As used herein a two part composition has two components that are kept separate until use. Shortly before use the two components are homogeneously mixed. The mixture can gel, increasing in viscosity and stiffness, at about room temperature and in a short time, for example about 20 minutes to about 240 minutes. During this time the mixture will increase in viscosity and stiffness to a point at which it is not convenient or even possible to use. This time is also referred to as working life. The mixture can subsequently cure, for example, in about 24 hours to about 240 hours to provide substantial physical properties. Because the two part epoxy composition begins to gel and cure at room temperature upon mixing of the resin component and the curing agent component, the mixture will have substantially no storage life beyond the cure time. Room temperature typically falls within the range of about 20° C. (68° F.) to about 25° C. (77° F.). The two part epoxy composition does not include a latent hardener as the main curing component. The two part epoxy composition does not require heat to initiate a cure reaction, although heat can be optionally used to accelerate an existing cure reaction or to "push" an existing cure reaction toward completion. The two part epoxy composition is distinguished from, and does not encompass, a single part epoxy composition comprising a storable mixture of epoxy resin and latent hardener. The single part epoxy composition is stable, e.g. does not gel or cure, at about room temperature for long periods of time and requires elevated temperatures to activate the latent curing agent and thereby initiate a reaction between the resin part and the hardener. The latent hardener of a single part composition can not initiate a reaction useful to cure the single part composition at about room temperature in a short time to provide substantial physical properties. One or both of the epoxy resin component and the curing agent component comprise one or more additives.

Cured reaction products of the disclosed epoxy composition can meet most or all of the chemical resistance and other requirements for sealing compounds set out in UL 674 section 45 and are useful as sealants and potting compounds for electrical equipment used under this standard. UL standard 674 and UL standard 1203 are each incorporated by reference herein in their entirety.

Typically, the epoxy composition, e.g. the mixture of epoxy resin component and curing agent component, comprises about 80 weight percent to about 100 weight percent of epoxy resin component.

Epoxy Resin Component

Epoxy resins are characterized by one or more of their precursors, structure, oxirane oxygen content and epoxy equivalent weight. The epoxy equivalent weight is the weight of resin required to obtain one equivalent of epoxy functional group. The epoxy resins can be semisolid epoxy resins, solid epoxy resins, liquid epoxy resins and mixtures of the above resins.

In general, a large number of polyepoxides having at least about two epoxy groups per molecule are available. The polyepoxides may be saturated, unsaturated, cyclic or acyclic, aliphatic, alicyclic, aromatic or heterocyclic polyepoxide compounds. Examples of polyepoxides include the polyglycidyl ethers, which are prepared by reaction of epichlorohydrin or epibromohydrin with a polyphenol in the presence of alkali. Other exemplary polyphenols are, for example, resorcinol, pyrocatechol, hydroquinone, bisphenol A (bis(4-hydroxyphenyl)-2,2-propane), bisphenol F (bis(4-hydroxyphenyl)methane), bis(4-hydroxyphenyl)-1,1-isobutane, 4,4'-dihydroxybenzophenone, bis(4-hydroxyphenyl)-1,1-ethane, and 1,5-hydroxynaphthalene. Other polyphenols used as the basis for the polyglycidyl ethers are the known condensation products of phenol and formaldehyde or acetaldehyde of the novolac resin-type.

Other polyepoxides include the polyglycidyl ethers of polyalcohols or diamines. Such polyglycidyl ethers are derived from polyalcohols, such as ethylene glycol, diethylene glycol, triethylene glycol, 1,2-propylene glycol, 1,4-butylene glycol, triethylene glycol, 1,5-pentanediol, 1,6-hexanediol or trimethylolpropane.

Other polyepoxides include polyglycidyl esters of polycarboxylic acids, for example, reaction products of glycidol or epichlorohydrin with aliphatic or aromatic polycarboxylic acids, such as oxalic acid, succinic acid, glutaric acid, terephthalic acid or a dimeric fatty acid. Other epoxides are derived from the epoxidation products of olefinically-unsaturated cycloaliphatic compounds or from natural oils and fats.

Polyglycidyl ether of bisphenol F resins and novolac resins are presently believed advantageous for use in this application as cured reaction products of these resins appear more chemically resistant than other epoxy resin types such as polyglycidyl ethers of bisphenol A.

In one embodiment the epoxy component comprises one or more novolac epoxy resins, one or more difunctional bisphenol F epoxy resins or a mixture of one or more novolac epoxy resins and one or more difunctional bisphenol F epoxy resins. D.E.N. 431 available from Dow Chemical Company and EPON 154 available from Hexion Specialty Chemicals are examples of novolac epoxy resins. EPON 863 available from Hexion Specialty Chemicals is an example of a difunctional bisphenol F epoxy resin.

In one embodiment the epoxy component comprises a combination of about 40% to about 99% by weight of epoxy component of one or more novolac epoxy resins and about 1% to about 60% by weight of epoxy component of one or more polyglycidyl bisphenol F epoxy resins.

In one embodiment the epoxy resin component consists essentially of a novolac resin, a diglycidyl ether of bisphenol F resin or a combination thereof. As used herein an epoxy component that consists essentially of a novolac resin, a difunctional bisphenol F resin or a combination thereof does not include epoxy resins other than a novolac resin or a difunctional bisphenol F resin but may include other non-epoxy resin components such as composition additives.

In one embodiment the epoxy component consists essentially of a combination of about 40% to about 99% by weight of epoxy component of one or more novolac epoxy resins and about 1% to about 60% by weight of epoxy component of one or more difunctional bisphenol F epoxy resins.

Curing Agent Component

The curing agent can comprise hardener compounds that initiate a cure reaction with the epoxy resin component at about room temperature. The hardener compound may function in a catalytic manner or, in advantageous embodiments, participate directly in the curing process by reaction with the epoxy resin component. Hardener compounds useful to cure the epoxy resin component at about room temperature include one or more of aliphatic amines (including linear aliphatic, branched aliphatic and cycloaliphatic amines), polyetheramines, polyamides, amidoamines, aromatic amines, and/or mixtures thereof. Polyamides are condensation products of polymerized fatty acids with polyalkyl polyamines prepared according to procedures well know in the art. Specific curing agents utilized will depend on the specific epoxy resin utilized in the epoxy resin component, cured product properties desired and to a lesser extent on the rate and degree of curing desired for the epoxy composition.

The curing agent component can include an aminopolyalkyeneamine component. Some useful aminopolyalkyeneamine components include, for example, ethylenediamine, diethylenetriamine, triethylenetetramine, tetraethylenepentamine, and polymers, oligomers, analogs, such as polyamides like the Versamid series (Cognis Co), and amidoamines like the Ancamide series (Air Products), and derivatives thereof, sold by many manufacturers, and well-known to those skilled in the art. Aliphatic and cycloaliphatic amines like the Ancamine series (Air Products) can advantageously be used in the curing agent component.

In principle, catalytically active tertiary acryl- or alkyl-amines, such as benzyldimethylamine, tris(dimethylamino) phenol, piperidine or piperidine derivatives, may also be useful. Various imidazole derivatives may also be useful as catalytically-active accelerators. Examples which may be mentioned are 2-ethyl-2-methylimidazole, N-butylimidazole, benzimidazole and N-$C_1$ to $C_{12}$-alkylimidazoles or N-arylimidazoles.

In one advantageous variation the curing agent component comprises an aliphatic or cycloaliphatic amine, an amine functional adduct of ethylene diamine and an epoxy resin, or a combination thereof.

In one advantageous embodiment the curing agent component comprises a combination of about 15% to about 85% by weight of curing agent component of an aliphatic amine and about 10% to about 60% by weight of curing agent component of amine functional adduct of ethylene diamine and an epoxy resin. ANCAMINE 2422 available from Air Products is an example of a cycloaliphatic amine and ANCAMINE 2410 is an example of an amine functional adduct of ethylene diamine and a bisphenol A epoxy resin. It is believed that a curing agent component comprising an amine functional adduct of a bisphenol F epoxy resin, when mixed with the epoxy resin component, would provide cured reaction products of that mixture with improved chemical resistance and better maintain compressive strength, dimensional stability and weight stability.

In one embodiment the curing agent component consists essentially of a combination of aliphatic amine and an amine functional adduct of an amine and an epoxy resin. As used herein a curing agent component consisting essentially of a combination of aliphatic amine and an amine functional adduct of an amine and an epoxy resin excludes curing agent components having curing agents that are not aliphatic amine and an amine functional adduct of an amine and an epoxy resin.

The amount of curing agent component utilized in the curable composition will depend upon a number of factors, including whether the hardener compound acts as a catalyst or participates directly in crosslinking of the composition, the concentration of epoxy groups and other reactive groups in the composition, the desired curing rate, temperature and so forth. Typically, the epoxy composition comprises about 1 to 40 weight percent of curing agent component.

It may be convenient to use a specific volumetric ratio of epoxy resin component to curing agent component, for example 1:1, 2:1, 3:1 or 4:1 ratios of epoxy resin component to curing agent component. Some applications are sensitive to heat and require sealants having a lower maximum cure temperature, for example about 150° C. and advantageously about 125° C. and desirably about 100° C. The use of relatively equal ratios, for example 1 or 2 parts epoxy resin component to 1 part curing agent component, is desirable for lessening heat evolved by the mixed composition during the cure reaction and thereby lessening the maximum cure temperature.

Composition Additives

The curable composition can optionally include one or more composition additives. As used herein a composition additive is a material that is formulated into either or both of the epoxy resin component or the curing agent component and remains present during use of the volumetric ratio of epoxy resin to curing agent. Composition additives include, for example, one or more of types of cure accelerators, particulate impact modifiers, auxiliary impact modifiers, auxiliary toughening agents, diluents, adhesion promoters, fillers, thixotropes, other adjuvants; or combinations thereof to provide the epoxy resin component, the curing agent component and/or the mixed epoxy composition with desirable physical and chemical properties and to provide cured reaction products of the epoxy composition with desirable physical and chemical properties. Naturally, the composition additives should not adversely impact chemical resistance or other properties of the cured reaction products allowing their use in this application.

Cure Accelerator

Cure accelerators are materials that materially shorten the gel time and/or increase completion of cure. Various compounds, such as tertiary amines, imides, polyamines, cyclicamines and arylamines also can be included in the epoxy composition as cure accelerators. Also included as potential accelerators, but not limited to these, are the following classes: strong acids, organic and inorganic acids, fluoro acids, fluoro-sulphonic acids, fluoro acetic acids, water, alcohols, phenols, fluoro-phenols, salicylic acid, amine, calcium, and metal salts of any or all the acids above, polyols, active hydrogen materials and their salts and/or complexes and the like. In one embodiment the epoxy composition comprises one or more cure accelerators, for example furfuryl alcohol or benzyl alcohol.

The useful amounts of accelerator typically range from about 0% by weight to about 30% by weight of the total composition. Desirably, an accelerator is present in an amount from about 1% by weight to about 10% by weight of the total composition.

Core-Shell Particulate Impact Modifier

Toughness of reaction products of the cured epoxy composition can be improved or modified by the incorporation of one or more types of particles having a core-shell structure, e.g. a particle having a core comprised of a first material surrounded by a shell comprised of a second material, wherein the first and second materials are typically different. The core-shell particle can have a core comprised of a polymeric material having elastomeric or rubbery properties (i.e., a glass transition temperature less than about 0° C., e.g., advantageously less than about −30° C.) surrounded by a shell comprised of a non-elastomeric polymeric material (i.e., a thermoplastic or thermoset/crosslinked polymer having a glass transition temperature greater than ambient temperatures, e.g., greater than about 50° C.).

The core can be formed predominantly from feed stocks of polybutadiene, polyacrylate, polystyrene, polybutadiene/styrene mixture, polybutadiene/acrylonitrile mixture, polyols and/or polysiloxanes or any other monomers that give a lower glass transition temperature. For example, the core can be comprised of a diene homopolymer or copolymer (for example, a homopolymer of butadiene or isoprene; a copolymer of butadiene or isoprene with one or more ethylenically unsaturated monomers such as vinyl aromatic monomers, (meth)acrylonitrile, (meth)acrylates, or the like) or an acrylate or methacrylate polymer. Other rubbery polymers may also be suitably be used for the core, including polybutylacrylate elastomer or polysiloxane elastomer (e.g., polydimethylsiloxane, particularly crosslinked polydimethylsiloxane).

The shell can be formed predominantly from feed stocks of polymethylmethacrylate, polystyrene or polyvinyl chloride or any other monomers that give a higher glass transition temperature. For example, the shell can be comprised of a polymer or copolymer of one or more monomers such as an acrylate, (meth)acrylate (e.g., methyl methacrylate), vinyl aromatic monomer (e.g., styrene), vinyl cyanide (e.g., acrylonitrile), unsaturated acids and anhydrides (e.g., acrylic acid), (meth)acrylamide, and the like having a suitably high glass transition temperature.

The core-shell particle may be comprised of more than two layers (e.g., a central core of one material may be surrounded by a second core of a different material or the core may be surrounded by two shells of different composition or the particle may have a soft core, hard shell, soft shell, hard shell structure. The particles can comprise a core and at least two concentric shells having different chemical compositions and/or properties. Either the core or the shell or both the core and the shell may be crosslinked (e.g., ionically or covalently). The shell may be grafted onto the core. The polymer comprising the shell may bear one or more different types of functional groups (e.g., epoxy groups) that are capable of interacting with other components of the compositions of the present invention.

Some of the core-shell particles structures available from Rohm and Haas are believed to have a core made from cross linked poly(butadiene/styrene) and a polymethylmethacrylate shell. Some of the core-shell particles structures available from Nippon Zeon are believed to have a core comprising an acrylate or methacrylate polymer having a glass transition of about −30° C. or lower and a shell comprising an acrylate polymer or a methacrylate polymer having a glass transition temperature of about 70° C. or higher.

The outer surface of the core-shell particle may be modified by reaction with a coupling agent, oxidizing agent or the like so as to enhance the ability to disperse the particle in the component (e.g., reduce agglomeration of the particles, reduce the tendency of the particles to settle out of the epoxy resin). Modification of the particle surface may also enhance the adhesion of the epoxy resin matrix to the particle when the adhesive is cured. The particle may alternatively be irradiated so as to change the extent of crosslinking of the polymer(s) constituting the particle in different regions of the particle. For example, the particle may be treated with gamma radiation such that the particle material is more highly crosslinked near the surface of the particle than in the center of the particle.

Particles treated with a reactive gas or other reagent to modify the outer surfaces of the particles by, for instance, creating polar groups (e.g., hydroxyl groups, carboxylic acid groups) on the particle surface, are also suitable for use in the present invention. Illustrative reactive gases include, for example, ozone, $Cl_2$, $F_2$, $O_2$, $SO_3$, and oxidative gases. Methods of surface modifying rubber particles using such reagents are known in the art and are described, for example, in U.S. Pat. Nos. 5,382,635; 5,506,283; 5,693,714; and 5,969,053, each of which is incorporated herein by reference in its entirety. Suitable surface modified rubber particles are also available from commercial sources, such as the rubbers sold under the tradename VISTAMER by Exousia Corporation.

Typically, the core will comprise from about 50 to about 95 percent by weight of the particle while the shell will comprise from about 5 to about 50 percent by weight of the particle.

The particles are relatively small in size. For example, the average particle size may be from about 30 nm to about 10,000 nm, advantageously from about 50 nm to about 5,000 nm. In certain embodiments the rubber particles have an average diameter of less than about 500 nm. For example, the core-shell particles may have an average diameter within the range of from about 25 nm to about 400 nm.

The core shell particles may be dispersed in a matrix, for example a liquid epoxy matrix. Examples of epoxy matrices include the diglycidyl ethers of bisphenol A, F or S, or biphenol, novolac epoxies, cycloaliphatic epoxies and phenolic resins such as bisphenol-A based phenoxies. Use of polyglycidyl ether of bisphenol F resins and novolac resins in the epoxy composition are presently believed advantageous.

The core shell particles dispersed in a matrix may be prepared as a masterbatch. For example, the particles are prepared as aqueous dispersions or emulsions. Such dispersions or emulsions may be combined with the desired liquid epoxy resin or mixture of liquid epoxy resins and the water and other volatile substances removed by distillation or the like to provide the masterbatch. Dispersions of particles having a core-shell structure in an epoxy resin matrix are available from Kaneka Corporation under the trade name KANE ACE MX.

Where the particles are initially provided in dry form, it may be advantageous to ensure that such particles are well dispersed in either or both of the epoxy resin component or the curing agent component. That is, agglomerates of core-shell particles are preferably broken up so as to provide discrete individual particles, which may be accomplished by intimate and thorough mixing of the dry particles with some or all of the other components. For example, dry particles may be blended with liquid epoxy resin for a length of time effective to essentially completely disperse the core-shell particles therein and break up any particle agglomerations.

The core shell particles may be present in the epoxy composition in an amount in the range of about 1% to about 50% by weight of the epoxy composition, advantageously about 2% to about 40% by weight of the epoxy composition and desirably about 10% to about 30% by weight of the epoxy composition. The lower limit will be based on the increase in toughness desired. At the higher ranges of core shell particle content, viscosity increases may be observed in the particle comprising component in relatively short periods of time. Use of higher amounts of core-shell particles will increase cost of the epoxy composition and may lower strength of the epoxy composition cured reaction products without providing a corresponding increase in toughness. The core shell particles can be formulated into either or both of the epoxy resin component or the curing agent component as desirable.

Auxiliary Impact Modifiers/Toughening Agents

The impact properties of epoxy composition cured reaction products can be improved or modified by the incorporation of one or more auxiliary impact modifiers and/or toughening agents. Suitable auxiliary impact modifier/toughening agents are generally polymeric or oligomeric in character, have glass transition (Tg) temperatures below 20° C. (advantageously below 0° C., more advantageously below −30° C. or below −50° C.), and may have one or more functional groups capable of participating in the cure reaction of the epoxy resin component. Suitable reactive functional groups include epoxy groups, hydroxyl groups, carboxylic acid groups and the like.

One type of auxiliary impact modifiers and/or toughening agent comprises the epoxy-based prepolymers (sometimes described as "adducts") obtained by reacting one or more epoxy resins with one or more amine-terminated polymers.

The epoxy resins useful for preparing epoxy based prepolymers may be selected from among the epoxy resins described hereinabove, with particular preference being given to the diglycidyl ethers of polyphenols such as bisphenol F. Liquid epoxy resins are preferred although mixtures of solid and liquid epoxy resins may be employed.

Amine terminated polymers useful for preparing epoxy-based prepolymers include, for example, one or more of:

Amine terminated polyethers such as linear amine-terminated polyoxyethylene ethers having the formula:

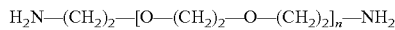

H$_2$N—(CH$_2$)$_2$—[O—(CH$_2$)$_2$—O—(CH$_2$)$_2$]$_n$—NH$_2$ in which n preferably is 17 to 27.

Amine terminated polyethers such as linear amine-terminated polyoxypropylene ethers having the formula:

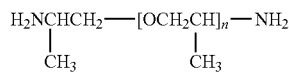

in which n preferably is 5 to 100. They are obtainable from Huntsman Chemical under the trade name JEFFAMINE® (D-series). The number average molecular weight of such amine-terminated polyoxypropylene ethers may vary, for example, from about 200 to about 2000.

Amine terminated polyethers such as trifunctional compounds having the formula:

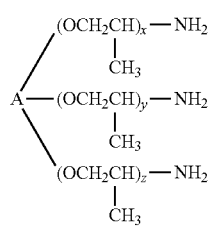

in which A is:

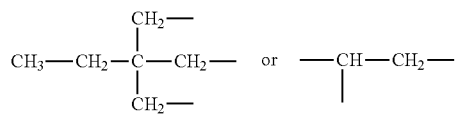

and x, y and z independently of each other are 1 to 40 and x+y+z is preferably >6. Representative examples of these trifunctional compounds are available commercially from Huntsman Chemical under the tradename JEFFAMINE® (T-series). Such substances typically have number average molecular weights of from about 400 to about 5000.

Amino silane capped polymers, such as those that may be embraced by the general formula:

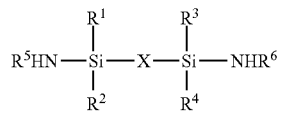

where $R^1$, $R^2$, $R^3$ and $R^4$ may be the same or different and are selected from hydrogen, hydroxyl, alkyl, alkoxy, alkenyl, alkenyloxy, aryl, and aryloxy; $R^5$ and $R^6$ may be the same or different and are selected from hydrogen, alkyl and aryl; and X is selected from alkylene, alkenylene, arylene, with or without interruption by a heteroatom; polyurethanes; polyethers; polyesters; polyacrylates; polyamides; polydienes; polysiloxanes; and polyimides.

Amine-terminated siloxanes, such as diamino siloxanes embraced by the formula:

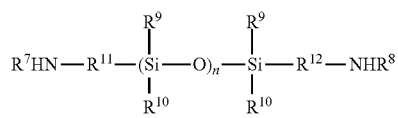

where $R^{11}$ and $R^{12}$ may be the same or different and are selected from alkylene, arylene, alkylene oxide, arylene oxide, alkylene esters, arylene esters, alkylene amides or arylene amides; $R^9$ and $R^{10}$ may be the same or different and are selected from alkyl or aryl; $R^7$ and $R^8$ are as defined above and n is 1-1,200.

Certain amino-modified silicone fluids that are commercially available from Shin-Etsu under the trade designations KF857, KF858, KF859, KF861, KF864 and KF880 may be useful. In addition, Wacker Silicones offers commercially a line of amino-functional silicone fluids designated as L650, L651, L653, L654, L655 and L656, and an amino-functional polydimethylsiloxane under the tradename WACKER FINISH WR 1600 that may be useful.

Other amino-functionalized silanes or siloxanes useful in forming the adduct include materials available from Degussa's Sivento division, such as a proprietary aminofunctional silane composition (DYNASYLAN® 1126), an oligomeric diaminosilane system (DYNASYLAN® 1146), N-vinylbenzyl-N'-aminoethyl-e-aminopropylpolysiloxane (DYNASYLAN® 1175), N-(n-butyl)-3-aminopropyltrimethoxysilane (DYNASYLAN® 1189), a proprietary aminofunctional silane composition (DYNASYLAN® 1204), N-(2-aminoethyl)-3-aminopropylmethyldimethoxysilane (DYNASYLAN® 1411), 3-aminopropylmthyldiethoxysilane (DYNA- SYLAN® 1505), 3-aminopropylmethyldiethoxysilane (DYNASYLAN® 1506), 3-aminopropyltriethoxysilane (DYNASYLAN® AMEO), a proprietary aminosilane composition (DYNASYLAN® AMEO-T), 3-aminopropyltrimethoxysilane (DYNASYLAN® AMMO), N-2-aminoethyl-3-aminopropyltrimethoxysilane (DYNASYLAN® DAMO), N-(2-aminoethyl)-3-aminopropyltrimethoxysilane (DYNASYLAN® DAMO-T) and a triamino-functional propyltrimethoxysilane (DYNASYLAN® TRIAMO).

Mixtures of amine-terminated polyethers may be used. Amine-terminated polyethers containing both oxyethylene and oxypropylene repeating units may also be utilized as the amino-terminated polyether. Preferably, the amino-terminated polyether contains at least two amine groups per molecule. Preferably, the amine groups are primary amine groups. The amino-terminated polyether is preferably aliphatic.

Generally speaking, the ratio of epoxide groups to amine groups in the adduct will be chosen based on use in the curable composition. An adduct having an excess of epoxy groups over amino groups (i.e., the epoxy-based prepolymer contains essentially no free amine groups) is useful for addition to an epoxy resin component. Typically, there is a 1.5 to 10-fold excess, for example a 3.5-fold excess of epoxy groups over the active hydrogen equivalents (AHEW) of the amine-terminated polyether. An excess of amino groups over epoxide groups (i.e., the epoxy-based prepolymer contains no free epoxide groups) is useful for addition to a curing agent component. Typically, the epoxy-based prepolymer is initially prepared in a first stage by reacting the epoxy resins with the amine-terminated polymer in the desired ratio and at an elevated temperature for a suitable time. The preparation of epoxy-based prepolymers from amine-terminated polyethers is known in the art and is described, for example, in U.S. Pat. Nos. 5,084,532 and 6,015,865, each of which is incorporated herein by reference in its entirety.

Other tougheners or impact modifiers known in the epoxy adhesive art may be useful in addition to, or as a substitute for, the aforementioned epoxy-based prepolymers. Generally speaking, such tougheners and impact modifiers are characterized by having glass transition temperatures below about 0° C., advantageously below about −30° C. and preferably below about −50° C. Examples of such tougheners and impact modifiers include, but are not limited to:

Reaction products of epoxy-reactive copolymers of conjugated dienes such as butadiene (especially epoxy-reactive copolymers of butadiene with relatively polar co-monomers such as (meth)acrylonitrile, (meth)acrylic acid, or alkyl acrylates, e.g., carboxyl-terminated butadiene-nitrile rubbers, such as the products available commercially from Noveon under the trade name HYCAR) with epoxy resins (as described, for example, in U.S. Patent Application Publication No. US 2005/0070634 and U.S. Pat. Nos. 6,776,869 and 6,998,011, each of which is incorporated herein by reference in its entirety);

Adducts of anhydrides (e.g., unsaturated anhydrides such as maleic anhydride)and diene polymers (e.g., liquid 1,4-cis polybutadienes), typically having number average molecular weights between about 1000 and about 5000, including for example, the adducts sold under the tradename POLYVEST by Degussa Corporation, as well as further reaction products of such adducts with epoxy resins;

Polyesters, including, for example, amorphous, crystalline and/or semi-crystalline polyesters, including saturated polyesters, prepared by condensation of aliphatic and/or aromatic dicarboxylic acids (or the corresponding alkyl esters or anhydrides with diols having a chain length of $C_2$ to $C_{20}$, the polyesters being of medium molecular weight (e.g., about 1000 to about 20,000 number average molecular weight), such as the polyesters sold under the tradename DYNACOLL by Degussa Corporation, and including polyesters functionalized with carboxylic acid and/or hydroxyl endgroups, as well as adducts of such functionalized polyesters with epoxy resins;

Adducts of dimeric fatty acids with epoxy resins (including, for example, the adducts sold under the tradename EPON 872 by Resolution Performance Products, the adducts sold under the tradename HYPDX DA323 (formerly ERISYS EMDA 3-23) by CVC Specialty Chemicals, as well as those adducts described in U.S. Pat. No. 5,218,063, incorporated herein by reference in its entirety);

Adducts of hydroxyl-containing triglycerides (e.g., castor oil) with epoxy resins (including, for example, the adducts sold under the tradename HELOXY 505 by Resolution Performance Products);

Adducts of polysulfides with epoxy resins (including, for example, the adducts sold under the tradename THIOPLAST EPS 350 by Akzo Nobel;

Adducts of amine-terminated polydienes and diene copolymers with epoxy resins;

Polyether prepolymers capped with hydroxyarylcarboxylic or hydroxyaralkylcarboxylic acids, or a capped polyester, polythiaester or polyamide containing polyether segments, as described, for example, in U.S. Pat. No. 5,202,390, incorporated herein by reference in its entirety, in particular the tougheners of formula I described in detail at column 1, line 59, to column 2, line 16, of said patent;

Block copolymers, wherein at least one polymeric block of the copolymer has a glass transition temperature below 20° C. (preferably below 0° C. or below −30° C. or below −50° C.) and at least one polymeric block of the copolymer has a glass transition temperature above 20° C. (preferably above 50° C. or above 70° C.), in particular block copolymers containing a polystyrene block, a 1,4-polybutadiene block (preferably having a glass transition temperature below about −60 degrees C.) and a polymethylmethacrylate block (preferably, having a highly, i.e., >80%, syndiotactic structure), such as the SBM copolymers made by living polymerization methods using nitroxide initiator (such as the methods described in U.S. Pat. Nos. 5,677,387, 5,686,534, and 5,886,112, each of which is incorporated herein by reference in its entirety, and sold under the tradename NANOSTRENGTH by Arkema and the block copolymers described in U.S. Pat. No. 6,894,113, incorporated herein by reference in its entirety;

Carboxyl-functionalized adducts of amino- or hydroxyl-terminated polymers and carboxylic anhydrides, as well as further reaction products of such adducts with epoxy resins (such as those described in U.S. Pat. No. 6,884,854 and U.S. Patent Application Publication No. 2005/0215730, each of which is incorporated herein by reference in its entirety);

Epoxy-terminated polyethers, such as polymers of alkylene oxides like ethylene oxide, propylene oxide or mixtures thereof that have been functionalized with epoxy groups, including by reacting the hydroxy groups of a polyalkylene glycol with epichlorohydrin;

Phenol-terminated and aminophenyl-terminated products produced by reacting a stoichiometric excess of a carboxylic anhydride or dianhydride with a diamine or polyamine and then further reacting the excess carboxylic anhydride or carboxylic acid groups with at least one polyphenol or aminophenol, as described, for example, in U.S. Patent Application Publication No. 2004/0181013, incorporated herein by reference in its entirety.

Mixtures of different auxiliary impact modifiers/toughening agents may be used. The auxiliary impact modifier/toughening agent may be present in the epoxy composition in an amount in the range of about 1% to about 50% by weight of the epoxy composition, advantageously about 5% to about 40% by weight of the epoxy composition and desirably about 10% to about 30% by weight of the epoxy composition. Cost and viscosity of the resulting composition part may dictate the upper limit. The auxiliary impact modifiers/toughening agents can be formulated into either or both of the epoxy resin component or the curing agent component as desirable.

Diluent

The curable composition can comprise one or more diluents. The diluent may be reactive or non-reactive. In the reactive sense, the diluent should possess functionality appropriate to react with components in the epoxy composition. In the non-reactive sense the diluent does not react with components and may affect the flexibility of the cured reaction products and/or be used to improve the mixability of the epoxy composition components. Examples of non-reactive diluents include EPODIL LV5 available from Air Products.

Reactive diluents can be monofunctional or advantageously can be polyfunctional. One reactive diluent is monofunctional epoxy resin. The monofunctional epoxy resin should have an epoxy group with an alkyl group, examples of which include $C_6$-$C_{28}$ alkyl glycidyl ethers, $C_6$-$C_{28}$ alkyl diglycidyl ethers, $C_6$-$C_{28}$ fatty acid glycidyl esters and $C_6$-$C_{28}$ alkylphenol glycidyl ethers. Another reactive diluent comprises a mono-epoxide (e.g., monoglycidyl ethers of alkyl- and alkenyl-substituted phenols).

Additional reactive diluents include those having (meth)acrylate and/or vinyl ether functionality. In some embodiments that include a reactive diluent, the reactive diluent is a "hybrid" diluent because it includes at least one vinyl ether or 1-alkenyl ether group and at least one (meth)acrylate group. For instance, the reactive diluent may be represented by the following formula (A):

(A)

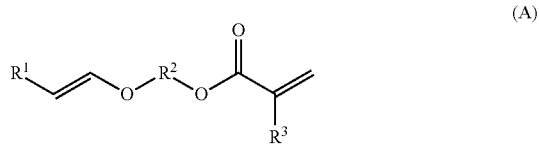

where $R^1$ is selected from hydrogen; aliphatic $C_{1-6}$ alkyl; and $C_{1-6}$ cycloalkyl; $R^2$ is selected from $C_{2-20}$ alkylene; $C_{2-20}$ hydrocarbon diradical; and polyalkylene oxide; and $R^3$ is selected from hydrogen and methyl.

The reactive diluent may have a molecular weight of less than about 1500. Advantageously, the molecular weight is less than about 750, more desirably less than about 500. The viscosity of the reactive diluent may be less than about 5000 cps at 25° C., more desirably less than about 2000 cps and even more desirably about 50-500 cps.

The epoxy composition disclosed herein may contain, for example, up to about 15 weight percent total of diluent. The diluent can be formulated into either or both of the epoxy resin component or the curing agent component as desirable.

Adhesion Promoter

The curable composition can comprise one or more products to help improve adhesion of reaction products of the cured epoxy composition to a substrate surface. Useful adhesion promoter materials include reaction products of epoxy resins and compounds containing chelating functional groups (herein called "chelate-modified epoxy resins") and functional silanes.

Such reaction products include those substances commonly referred to as "chelate epoxies" or "chelating epoxy resins". The chelating functional groups include those functional groups capable of forming chelate bonds with divalent or polyvalent metal atoms, either by themselves or in cooperation with other functional groups positioned on the same molecule. Suitable chelating functional groups include, for example, phosphorus-containing acid groups (e.g., —PO(OH)$_2$), carboxylic acid groups (—CO$_2$H), sulfur-containing acid groups (e.g., —SO$_3$H), amino groups, and hydroxyl groups (particularly hydroxyl groups adjacent to each other on aromatic rings). The preparation of such reaction products may be carried out by methods known in the art such as, for example, those methods described in U.S. Pat. Nos. 4,702,962 and 4,340,716, European Patent No. EP 342 035 and Japanese Patent Document Nos. JP 58-063758 and JP 58-069265, each of which is incorporated herein by reference in its entirety. Reaction products of epoxy resins and compounds containing chelating functional groups are also available from commercial sources such as, for example, the ADEKA Resins EP-49-10N, EP-49-55C, EP-49-10, EP-49-20, EP-49-23, and EP-49-25 sold by Asahi Denka.

Other compounds having metal chelating properties may also be used to help enhance the adhesion of the cured adhesive to a substrate surface, including, for example, the adhesion promoters described in U.S. Patent Application Publication No. U.S. 2005/0129955, incorporated herein by reference in its entirety. Also suitable for use as adhesion promoters are the acetoacetate-functionalized modifying resins sold by King Industries under the brand name K-FLEX XM-B301.

Some functional silanes include a reactive component that can bond or interact with the composition, a silane component that can react with substrates and/or other silane modified materials and a hydrolysable component. Some functional silanes having an epoxy reactive component are sold by Momentive Performance Materials Inc. of Connecticut.

The epoxy composition disclosed herein may contain, for example, up to about 6 weight percent of adhesion promoter. The adhesion promoter can be formulated into either or both of the epoxy resin component or the curing agent component as desirable.

Fillers

The curable composition can optionally comprise one or more types of fillers, such as the various platy (flake like) fillers; various ground or precipitated chalks; quartz powder; silica powder; alumina; non-platy clays; dolomite; various fibers such as carbon fibers, glass fibers, microballons, polymeric fibers; fused silica; carbon black; metal oxides such as calcium oxide; metal dioxides such as titanium dioxide; metal carbonates such as calcium magnesium carbonate; barite; and silicate-like fillers of the aluminum magnesium calcium silicate type, for example wollastonite and chlorite. The filler can optionally be surface treated, for example, by reaction with a coupling agent such as a silane. Filler can be formulated into either or both of the epoxy resin component or the curing agent component as desirable.

Adding micron sized silica particles does not increase chemical resistance of the curable composition. Surprisingly, adding nanometer sized (typically about 1 to about 100 nanometers, for example about 20 nanometers) silica particles does appear to improve chemical resistance of the curable composition. One exemplary nanosilica material is NANOPDX F520 available from Nanoresins AG in Geesthacht, Germany. Nanopox F520 is described as a masterbatch of bisphenol F based epoxy resin system and 40% silica particles having diameter of about 20 nanometers.

Useful amounts of filler typically range from about 0% by weight to about 60% by weight of the total composition. Advantageously, fillers are present in an amount from about 0% by weight to about 45% by weight of the total composition.

Thixotrope

Any suitable thixotrope can be included in the present inventive compositions. Suitable thixotropic agents include, for example, Disparlon 6100, Disparlon 6200 (King Industries, Science Rd., Norwalk, Conn.), organo clay, fumed silica, inert and/or functional fillers, plastic fillers, and polyamide powder. Useful amounts of thixotropes typically range from about 0% by weight to about 30% by weight of the total composition. Desirably, a thixotrope is present in an amount from about 1% by weight to about 10% by weight of the total composition.

Adjuvants

The curable composition can optionally comprise other common adjuvants, such as flow auxiliaries, coupling agents (e.g., silanes), tackifiers, flame retardants, rheology control agents, inhibitors, corrosion inhibitors, antioxidants, stabilizers, thickeners, plasticizers, elastomers, thermoplastics, coloring agents, shelf-life extenders (for example, zinc chloride), industrial microbiostats, surfactants or wetting agents (for example, Zonyl® FSO, which is sold by DuPont), polymerization inhibitors, and other well-known additives, and combinations thereof to further modify physical and chemical properties of the epoxy composition and/or cured reaction products obtained from the epoxy composition.

Depending on desired properties the relative proportions of the individual components may vary within comparatively wide limits. The adjuvants can be formulated into either or both of the epoxy resin component or the curing agent component as desirable.

The composition comprising each component can be prepared separately by mixing together the constituents. In preparing the epoxy resin component dry materials can be combined with liquid or liquefied materials using conventional processes and equipment to form a viscous, fluid epoxy resin component. The fluid epoxy resin component can be packaged as convenient for storage and later use. In preparing the curing agent component, dry materials can be combined with the liquid or liquefied materials using conventional processes and equipment to form a viscous, fluid curing agent component. The curing agent component can be packaged as convenient for storage and later use.

Methods of Use

The disclosed composition is suitable for use in potting and sealing openings in electrical equipment for use in hazardous locations.

The epoxy resin component and curing agent component are stored separately. The two parts can be homogeneously mixed to form the curable composition shortly before use. The mixed, curable composition can typically be applied at about room temperature to the aperture or area to be sealed. The mixed composition can have a viscosity of about 8,000 cps to about 30,000 cps.

Once the epoxy resin component and curing agent component are mixed the curing process starts. It is not necessary to heat the mixed composition or substrates to begin the curing process. Temperature control can optionally be used to modify the time required for the mixed composition to cure. The mixed epoxy composition can have a work life of about 20 to about 60 minutes before the mixed composition reacts to a non-flowable but not fully cured state.

In one embodiment the disclosed epoxy resin component and curing agent component can each be components of a two part adhesive package. Each component can be chemically separated and packaged as convenient for use. The epoxy resin component and curing agent component can typically be homogeneously mixed and dispensed onto a substrate. For example, each component can be contained in one chamber of a cartridge. The cartridges are placed in a dual cartridge applicator so that actuation of the applicator dispenses predefined volumes of the epoxy resin component and curing agent component. The dispensed components are forced through a mixing nozzle and the mixed composition is dispensed into an aperture or other area to be sealed. Automated application equipment for mixing and dispensing a two part curable composition is known. The use of a liquid or flowable resin component and a liquid or flowable curing agent component is advantageous for mixing and dispensing and also allows the dispensed composition to flow into the aperture or area to be sealed and around any wires or other projections in the area to be sealed.

The following examples are included for purposes of illustration so that the disclosure may be more readily understood and are in no way intended to limit the scope of the disclosure unless otherwise specifically indicated.

The following test methods are referred to in the EXAMPLES.

Chemical Resistance (UL 674)

Note that UL 674 refers to requirements for sealed equipment, including requirements for components such as sealants used in the equipment. UL 1203 is an equivalent standard for sealants only.

The epoxy resin component and curing agent component are mixed and cured to form cylindrical specimens of cured sealant material 0.5 inches in diameter and 0.75 inches long having ends perpendicular to the sides of the cylinder. Each specimen is measured and weighted. Three specimens are tested for compression strength. The remaining specimens are segregated into six specimen sets and each set is exposed for 7 days (168 hours) to saturated vapors of one of the following chemicals.

a. acetic acid, glacial
   b. acetone
   c. ammonium hydroxide, 20% by weight
   d. ASTM reference fuel C
   e. diethyl ether
   f. ethyl acetate
   g. ethylene dichloride
   h. furfural
   i. n-hexane
   j. methyl ethyl ketone
   k. methanol
   l. 2-nitropropane
   m. toluene After 168 hours of exposure three specimens from each set are measured, weighed and observed for discoloration, swelling, shrinking, cracking, crazing, leaching or dissolving. The other three specimens in the set are individually placed between plates in a compression testing machine and subjected to increasing compressive loading at a crosshead speed of 0.1 inch per minute. The load is applied perpendicular to the axis of the specimen cylinder and the compressive force required to crack or break each specimen is recorded.

Suitable materials for hazardous location use must retain at least 85% of their compressive strength after 168 hours of exposure to any chemical vapor in the panel and must not lose or gain more than 1% of their initial weight after 168 hours of exposure to any chemical vapor in the panel and must not discolor, swell, shrink, crack, craze, leach or dissolve after 168 hours of exposure to any chemical vapor in the panel.

Viscosity

Viscosity of composition components and freshly mixed epoxy composition is tested using a Brookfield Viscometer with a #14 rotor turning at 10 revolutions per minute. Compositions and components are tested at room temperature.

EXAMPLE 1

A two part epoxy composition was made.

| composition 1 | |
|---|---|
| amount | material |
| epoxy resin component | |
| 40-100% | epoxy novolac resin produced by reacting phenol-formaldehyde novolac and epichlorohydrin[1] |
| 0-60% | difunctional epoxy resin produced by reacting bisphenol F and epichlorohydrin[2] |
| 0-20% | epoxy novolac resin produced by reacting phenolic novolac resin and epichlorohydrin[3] |
| curing agent component | |
| 15-85% | aliphatic amine[4] |
| 10-60% | amine functional adduct of ethylene diamine (EDA) and liquid epoxy resin with low residual EDA.[5] |

[1] D.E.N. 431 available from Dow Chemical Company.
[2] EPON Resin 863 available from Hexion Specialty Chemicals.
[3] EPON Resin 154 available from Hexion Specialty Chemicals.
[4] ANCAMINE 2422 available from Air Products.
[5] ANCAMINE 2410 available from Air Products.

Each component is separately prepared by mixing the ingredients of that component to a homogeneous state. The epoxy resin component had a viscosity of about 20,000 cps. The curing agent component had a viscosity of about 10,000 cps.

The two components were homogeneously mixed at a ratio of 2 parts epoxy resin component to 1 part curing agent component by volume. The mixed two part epoxy composition had an initial viscosity of about 15,000 cps. The mixed two part epoxy composition had a work life of less than 30 minutes; and was solid in less than 120 minutes at room temperature.

EXAMPLE 1

A two part epoxy composition having a shortened cure time can be made.

| composition 1 | |
|---|---|
| amount | material |
| epoxy resin component | |
| 40-100% | epoxy novolac resin produced by reacting phenol-formaldehyde novolac and epichlorohydrin[1] |
| 0-60% | difunctional epoxy resin produced by reacting bisphenol F and epichlorohydrin[2] |
| 0-20% | epoxy novolac resin produced by reacting phenolic novolac resin and epichlorohydrin[3] |
| curing agent component | |
| 15-85% | aliphatic amine[4] |
| 10-60% | amine functional adduct of ethylene diamine (EDA) and liquid epoxy resin with low residual EDA.[5] |
| 0-60% | cure accelerator[6] |
| 0-60% | cure accelerator[7] |

[1] D.E.N. 431 available from Dow Chemical Company.
[2] EPON Resin 863 available from Hexion Specialty Chemicals.
[3] EPON Resin 154 available from Hexion Specialty Chemicals.
[4] ANCAMINE 2422 available from Air Products.
[5] ANCAMINE 2410 available from Air Products.
[6] 2-furanmethanol, cas number 98-00-0
[7] benzyl alcohol, cas number 100-51-6

Each component can be separately prepared by mixing the ingredients of that component to a homogeneous state. The epoxy resin component had a viscosity of about 20,000 cps. The curing agent component had a viscosity of about 10,000 cps.

The two components were homogeneously mixed at a ratio of 2 parts epoxy resin component to 1 part curing agent component by volume. The mixed two part epoxy composition of EXAMPLE 1 (without cure accelerator) had a work life of more than 60 minutes. The mixed two part epoxy composition of EXAMPLE 1 (with cure accelerator) had a work life of less than 30 minutes.

In a screening test the cured composition retained at least 85% of its compression strength after exposure to glacial acetic acid, acetone and ethylene dichloride under the UL 674 test.

EXAMPLE 2

A two part epoxy composition was made by combining the following:

| composition 2 | |
|---|---|
| amount | material |
| epoxy resin component | |
| 50-70% | epoxy novolac resin produced by reacting phenol-formaldehyde novolac and epichlorohydrin[1] |
| 30-50% | difunctional epoxy resin produced by reacting bisphenol F and epichlorohydrin[2] |
| 0.1-1% | Titanium dioxide powder[3] |
| 0.005-0.02 | air release agent[4] |
| curing agent component | |
| 30-50% | aliphatic amine[5] |
| 30-50% | amine functional adduct of ethylene diamine (EDA) and liquid epoxy resin with low residual EDA[6] |
| 10-30% | 2-furanmethanol[7] |

-continued composition 2

| amount | material |
|---|---|
| 0.1-2.0% | carbon black[8] |
| 0.005-0.02 | air release agent[4] |

[1]D.E.N. 431 available from Dow Chemical
[2]EPON Resin 863 available from Hexion Specialty Chemicals
[3]R-900 available from E. I. DuPont de Nemours and Company.
[4]PC-1244 available from Monsanto Co.
[5]ANCAMINE 2422 available from Air Products.
[6]ANCAMINE 2410 available from Air Products.
[7]cas number 98-00-0
[8]MONARCH 700 available from Cabot Corp.

The ingredients of each component were separately combined and mixed to a homogeneous state. The curing agent component was degassed and nitrogen purged to lessen air entrapment. The epoxy resin component had a white appearance; a specific gravity of about 1.20; and a viscosity of about 20,000 cps. The curing agent component had a black appearance; a specific gravity of about 1.20; and a viscosity of about 10,000 cps.

When mixed at 2 parts epoxy resin component to 1 part curing agent component by volume the resulting mixture had a black appearance and an initial viscosity of about 15,000 cps. The mixed two part epoxy composition has a gel time of less than 30 minutes; will be solid in less than 120 minutes and will cure to full strength in 1 to 7 days at room temperature.

The cured composition passed the exposure test except for glacial acetic acid (weight gain of 3.5%) and methanol (weight gain of 1.9%). The cured composition retained at least 85% of its compression strength after exposure to all of the UL 674 test panel chemicals. The mixed and uncured epoxy composition had a maximum 150° C. exotherm temperature when tested using Differential Scanning Calorimeter.

EXAMPLE 3

A two part epoxy composition was made by combining the following:

composition 3

| amount | material |
|---|---|
| | epoxy resin component |
| 50-70% | epoxy novolac resin produced by reacting phenol-formaldehyde novolac and epichlorohydrin[1] |
| 30-50% | difunctional epoxy resin produced by reacting bisphenol F and epichlorohydrin and adding nano size silica[2] |
| 0.1-1% | Titanium dioxide powder[3] |
| 0.005-0.02 | air release agent[4] |
| | curing agent component |
| 30-50% | aliphatic amine[5] |
| 30-50% | amine functional adduct of ethylene diamine (EDA) and liquid epoxy resin with low residual EDA[6] |
| 10-30% | 2-furanmethanol[7] |

-continued composition 3

| amount | material |
|---|---|
| 0.1-2.0% | carbon black[8] |
| 0.005-0.02 | air release agent[4] |

[1]D.E.N. 431 available from Dow Chemical
[2]NANOPOX F520 available from NanoResins AG, Geesthacht, Germany.
[3]R-900 available from E. I. DuPont de Nemours and Company.
[4]PC-1244 available from Monsanto Co.
[5]ANCAMINE 2422 available from Air Products.
[6]ANCAMINE 2410 available from Air Products.
[7]cas number 98-00-0
[8]MONARCH 700 available from Cabot Corp.

The ingredients of each component were separately combined and mixed to a homogeneous state. The curing agent component was degassed and nitrogen purged to lessen air entrapment. The epoxy resin component had a white appearance; a specific gravity of about 1.20; and a viscosity of about 20,000 cps. The curing agent component had a black appearance; a specific gravity of about 1.20; and a viscosity of about 10,000 cps.

When mixed at 2 parts epoxy resin component to 1 part curing agent component by volume the resulting mixture had a black appearance and an initial viscosity of about 15,000 cps. The mixed two part epoxy composition has a gel time of less than 30 minutes; will be solid in less than 120 minutes and will cure to full strength in 1 to 7 days at room temperature.

The cured composition passed the exposure test except for glacial acetic acid (weight gain of 1.4%; length change of 1.4% and diameter change of 1.6%) and methanol (weight gain of 1.9%). The cured composition retained at least 85% of its compression strength after exposure to all of the UL 674 test panel chemicals. The mixed and uncured epoxy composition had a maximum 150° C. exotherm temperature when tested using Differential Scanning Calorimeter.

It is believed that cured reaction products of composition 3 can pass all of the UL 674 chemical resistance tests if the amine functional adduct of ethylene diamine (EDA) and liquid epoxy resin is replaced with an amine functional adduct of an amine and a bisphenol F resin.

As an alternative, UL 674 section 45.8 allows tests to determine resistance of the sealing compound to chemicals to be conducted on a complete sample or subassembly representative of the construction to be approved and incorporating the sealing compound as intended in the final assembly but without cables or conductors. It is believed that an electrical assembly incorporating sealing composition 3 can pass UL 674 under this alternative.

EXAMPLE 4

Two part epoxy compositions A-V were made by combining materials shown in the following tables. The materials of each component were separately combined and mixed to a homogeneous state. The curing agent component was degassed and nitrogen purged to lessen air entrapment. The two components were homogeneously mixed at a ratio of 2 parts epoxy resin component to 1 part curing agent component by volume.

comparative compositions A-E

| material | A | B | C | D | E |
|---|---|---|---|---|---|
| | \multicolumn{5}{c}{amount (wt %)} | | | | |
| *epoxy resin component* | | | | | |
| epoxy novolac resin produced by reacting phenol-formaldehyde novolac and epichlorohydrin[1] | 65 | 65 | 58.5 | 58.5 | 51.6 |
| difunctional epoxy resin produced by reacting bisphenol F and epichlorohydrin[2] | 20 | 20 | 18 | 18 | 15.9 |
| epoxy novolac resin produced by reacting phenolic novolac resin and epichlorohydrin[3] | 14 | 14 | 12.6 | 12.6 | 11.1 |
| low viscosity aliphatic triglycidyl ether[4] | 1 | 1 | 0.9 | 0.9 | 0.8 |
| difunctional epoxy resin produced by reacting bisphenol A and epichlorohydrin[5] | 0 | 0 | 10 | 10 | 20.6 |
| *curing agent component* | | | | | |
| aliphatic amine[6] | 9.3 | 9.5 | 7.9 | 8.0 | 6.3 |
| amine functional adduct of ethylene diamine (EDA) and liquid epoxy resin with low residual EDA[7] | 0 | 0 | 0 | 0 | 0 |
| modified amine[8] | 43.7 | 58.6 | 44.9 | 59.9 | 45.2 |
| modified aliphatic amine[9] | 43.7 | 28.6 | 44.4 | 28.8 | 45.2 |
| modified aliphatic amine[10] | 3.3 | 3.3 | 3.3 | 3.3 | 3.3 |

[1] D.E.N. 431 available from Dow Chemical Company.
[2] EPON Resin 863 available from Hexion Specialty Chemicals.
[3] EPON Resin 154 available from Hexion Specialty Chemicals.
[4] HELOXY 48 available from Hexion Specialty Chemicals.
[5] EPON Resin 828 available from Hexion Specialty Chemicals.
[6] ANCAMINE 2422 available from Air Products.
[7] ANCAMINE 2410 available from Air Products.
[8] ANCAMINE 2334 available from Air Products.
[9] ANCAMINE 2432 available from Air Products.
[10] ANCAMINE 1608 available from Air Products.

comparative compositions F-J

| material | F | G | H | I | J |
|---|---|---|---|---|---|
| | \multicolumn{5}{c}{amount (wt %)} | | | | |
| *epoxy resin component* | | | | | |
| epoxy novolac resin produced by reacting phenol-formaldehyde novolac and epichlorohydrin[1] | 51.6 | 65 | 65 | 58.5 | 58.5 |
| difunctional epoxy resin produced by reacting bisphenol F and epichlorohydrin[2] | 15.9 | 20 | 20 | 18 | 18 |
| epoxy novolac resin produced by reacting phenolic novolac resin and epichlorohydrin[3] | 11.1 | 14 | 14 | 12.6 | 12.6 |
| low viscosity aliphatic triglycidyl ether[4] | 0.8 | 1 | 1 | 0.9 | 0.9 |
| difunctional epoxy resin produced by reacting bisphenol A and epichlorohydrin[5] | 20.6 | 0 | 0 | 10 | 10 |
| *curing agent component* | | | | | |
| aliphatic amine[6] | 6.5 | 7.4 | 7.6 | 5.9 | 6.2 |
| amine functional adduct of ethylene diamine (EDA) and liquid epoxy resin with low residual EDA[7] | 0 | 15 | 15 | 15 | 15 |
| modified amine[8] | 60.7 | 37.2 | 50 | 37.9 | 51 |
| modified aliphatic amine[9] | 29.5 | 37.2 | 24.1 | 37.9 | 24.5 |
| modified aliphatic amine[10] | 3.3 | 3.3 | 3.3 | 3.3 | 3.3 |

[1] D.E.N. 431 available from Dow Chemical Company.
[2] EPON Resin 863 available from Hexion Specialty Chemicals.
[3] EPON Resin 154 available from Hexion Specialty Chemicals.
[4] HELOXY 48 available from Hexion Specialty Chemicals.
[5] EPON Resin 828 available from Hexion Specialty Chemicals.
[6] ANCAMINE 2422 available from Air Products.
[7] ANCAMINE 2410 available from Air Products.
[8] ANCAMINE 2334 available from Air Products.
[9] ANCAMINE 2432 available from Air Products.
[10] ANCAMINE 1608 available from Air Products.

comparative compositions H-O

| material | K | L | M | N | O |
|---|---|---|---|---|---|
| | \multicolumn{5}{c}{amount (wt %)} | | | | |
| *epoxy resin component* | | | | | |
| difunctional epoxy resin produced by reacting bisphenol A and epichlorohydrin[1] | 100 | 100 | 100 | 100 | 100 |
| *curing agent component* | | | | | |
| aliphatic amine[2] | 53.5 | 50.7 | 48 | 100 | 94.7 |
| modified amine[3] | 0 | 0 | 0 | 100 | 94.7 |
| TEPA[4] | 0 | 1.7 | 3.5 | 0 | 0 |
| 2-furanmethanol[5] | 46.5 | 47.6 | 48.5 | 0 | 2.6 |

[1] EPON Resin 828 available from Hexion Specialty Chemicals.
[2] ANCAMINE 2422 available from Air Products.
[3] ANCAMINE 2334
[4] tetraethylenepentamine - mixture of four TEPA ethyleneamines including:
TEPA CAS #000112-57-2, N-(2-aminoethyl)-N'-{2-(2-aminoethyl)amino}ethyl}-1,2-ethanediamine;
AETETA CAS #031295-46-2, 4-(2-aminoethyl)-N-(2-aminoethyl)-N'-{2-{(2-aminoethyl)amino}ethyl}-1,2-ethanediamine;
APEEDA CAS #031295-54-2, 1-(2-aminoethyl)-4-[(2-aminoethyl)-amino]ethyl]-piperazine;
PEDETA CAS #031295-49-5, 1-[2-[[2-[(2-aminoethyl)amino]ethyl]-amino]ethyl]-piperazine
[5] cas number 98-00-0 comparative compositions P-T

| material | P | Q | R | S | T |
|---|---|---|---|---|---|
| | \multicolumn{5}{c}{amount (wt %)} | | | | |
| *epoxy resin component* | | | | | |
| difunctional epoxy resin produced by reacting bisphenol A and epichlorohydrin[1] | 100 | 100 | 100 | 100 | 100 |
| *curing agent component* | | | | | |
| aliphatic amine[2] | 5.3 | 10.8 | 21.6 | 43 | 48 |
| modified amine[3] | 89.8 | 79.6 | 59.3 | 19.2 | 9.9 |
| TEPA[4] | 0 | 0 | 0 | 0 | 0 |
| 2-furanmethanol[5] | 4.9 | 9.6 | 19.1 | 37.8 | 42.1 |

[1] EPON Resin 828 available from Hexion Specialty Chemicals.
[2] ANCAMINE 2422 available from Air Products.
[3] ANCAMINE 2334
[4] tetraethylenepentamine - mixture of four TEPA ethyleneamines including:
TEPA CAS #000112-57-2, N-(2-aminoethyl)-N'-{2-(2-aminoethyl)amino}ethyl}-1,2-ethanediamine;
AETETA CAS #031295-46-2, 4-(2-aminoethyl)-N-(2-aminoethyl)-N'-{2-{(2-aminoethyl)amino}ethyl}-1,2-ethanediamine;
APEEDA CAS #031295-54-2, 1-(2-aminoethyl)-4-[(2-aminoethyl)-amino]ethyl]-piperazine;
PEDETA CAS #031295-49-5, 1-[2-[[2-[(2-aminoethyl)amino]ethyl]-amino]ethyl]-piperazine
[5] cas number 98-00-0

| comparative compositions U-V | | |
|---|---|---|
| | U | V |
| material | amount (wt %) | |
| epoxy resin component | | |
| difunctional epoxy resin produced by reacting bisphenol A and epichlorohydrin[1] | 100 | 100 |
| curing agent component | | |
| aliphatic amine[2] | 21.6 | 42 |
| modified amine [3] | 54.5 | 16.3 |
| TEPA [4] | 1.7 | 1.7 |
| 2-furanmethanol[5] | 22.2 | 40 |

[1]EPON Resin 828 available from Hexion Specialty Chemicals.
[2]ANCAMINE 2422 available from Air Products.
[3] ANCAMINE 2334
[4] tetraethylenepentamine - mixture of four TEPA ethyleneamines including:
TEPA CAS #000112-57-2, N-(2-aminoethyl)-N'-{2-(2-aminoethyl)amino}ethyl}-1,2-ethanediamine;
AETETA CAS #031295-46-2, 4-(2-aminoethyl)-N-(2-aminoethyl)-N'-{2-{(2-aminoethyl)amino}ethyl}-1,2-ethanediamine;
APEEDA CAS #031295-54-2, 1-(2-aminoethyl)-4-[(2-aminoethyl)-amino]ethyl]-piperazine;
PEDETA CAS #031295-49-5, 1-[2-[[2-[(2-aminoethyl)amino]ethyl]-amino]ethyl]-piperazine
[5]cas number 98-00-0

UL 674 specifies weight changes of less than 1%. Compositions A through J had weight gains of 10.6% to 12.6% after exposure to glacial acetic acid vapors per UL 674. Compositions A through J had weight gains of 4.1% to 6.7% after exposure to acetone vapors per UL 674. UL 674 specifies a retained compression strength (crush force) of ≥85%. Compositions K through V had an unacceptable loss of compression strength after exposure to either acetone or glacial acetic acid vapors per UL 674 as shown below.

| | K | M | Q | T | U | V |
|---|---|---|---|---|---|---|
| % retention after exposure to glacial acetic acid vapor | 70.4 | 74.6 | 55.8 | 68.6 | 66 | 67.2 |
| % retention after exposure to acetone vapor | 78.6 | 82.3 | 61.3 | 76.8 | 72.5 | 77.4 |

As seen from comparative compositions A-V almost all epoxy compositions will not satisfy the requirements of UL 674 and will not be suited for use in hazardous locations as they will not retain at least 85% of their compressive strength after 168 hours of exposure to a chemical vapor in the panel or they will lose or gain more than 1% of their initial weight after 168 hours of exposure to a chemical vapor in the panel or they will discolor, swell, shrink, crack, craze, leach or dissolve after 168 hours of exposure to a chemical vapor in the panel. Compositions 1-3 provide epoxy compositions that are believed to satisfy at least the alternative requirements of UL 674. Replacing the amine adduct in compositions 1-3 with an amine adduct of bisphenol F epoxy is believed to increase chemical resistance and allow cured reaction product samples to pass the UL 674 requirements. These epoxy compositions are unusual and surprising in their ability to satisfy most or all of these UL requirements.

While preferred embodiments have been set forth for purposes of illustration, the foregoing description should not be deemed a limitation of the disclosure herein. Accordingly, various modifications, adaptations and alternatives may occur to one skilled in the art without departing from the spirit and scope of the present disclosure.

What is claimed:

1. A two part, epoxy composition suitable for sealing equipment for use in Division 1 hazardous locations, consisting of an epoxy resin component and a curing agent component:
    the epoxy resin component consisting of an epoxy resin and optionally additives, wherein the epoxy resin is selected from the group consisting of a novolac epoxy resin, a bisphenol F epoxy resin, a difunctional bisphenol F epoxy resin or a mixture thereof, and wherein the additives are selected from the group consisting of particulate impact modifier, auxiliary impact modifier, auxiliary toughening agent, diluent, adhesion promoter, filler, thixotrope, air release agent, adjuvant, 2-furanmethanol, benzyl alcohol, and combinations thereof, wherein the epoxy resin component does not include bisphenol A epoxy resin; and
    a curing agent component separated from the epoxy resin component consisting of a curing agent and optionally additives, wherein the curing agent is selected from the group consisting of an aliphatic amine, an amine functional adduct of ethylene diamine and an epoxy resin, an amine functional adduct of an amine and a bisphenol F epoxy resin, an aliphatic amine and an amine functional adduct of ethylene diamine and an epoxy resin and a mixture thereof, and wherein the additives are selected from the group consisting of particulate impact modifier, auxiliary impact modifier, auxiliary toughening agent, diluent, adhesion promoter, filler, thixotrope, air release agent, adjuvant, 2-furanmethanol, benzyl alcohol, and combinations thereof;
    wherein a mixture of the two part, epoxy composition is curable at room temperature and at least one of the epoxy resin component and the curing agent component includes 2-furanmethanol.

2. Cured reaction products of a mixture of the two part epoxy composition of claim 1.

3. The two part, epoxy composition of claim 1 wherein the adjuvant is selected from flow auxiliary, coupling agent, tackifier, flame retardant, rheology control agent, inhibitor, antioxidant, stabilizer, thickener, plasticizer, elastomer, thermoplastic, coloring agent, shelf life extender, surfactant, wetting agent, polymerization inhibitor and combinations thereof.

4. The two part, epoxy composition of claim 1 wherein a mixture of the two part, epoxy composition has a viscosity of about 8,000 to about 30,000 cps.

5. The two part, epoxy composition of claim 1 wherein the epoxy resin component and the curing agent component do not include bisphenol A epoxy resin.

6. An electrical device, comprising:
    a housing defining an aperture providing a route between a housing exterior and a housing interior volume; and
    a mixed two part, room temperature curable epoxy composition sealing the aperture, wherein the epoxy composition consists of an epoxy resin component and a curing agent component, the mixed epoxy composition having a viscosity of about 8,000 to about 30,000 cps;
    the epoxy resin component consisting of an epoxy resin and optionally additives, wherein the epoxy resin is selected from the group consisting of a novolac epoxy resin, a bisphenol F epoxy resin, a difunctional bisphenol F epoxy resin and a mixture thereof; and wherein the additives are selected from the group consisting of particulate impact modifier, auxiliary impact modifier, auxiliary toughening agent, diluent, adhesion promoter, filler, thixotropes, air release agent, adjuvant, 2-furanmethanol, benzyl alcohol, and combinations thereof; and the curing agent component consisting of a curing agent and optionally additives, wherein the curing agent is selected from the group consisting of an aliphatic amine, an amine functional adduct of ethylene diamine and an epoxy resin, an amine functional adduct of an amine and a bisphenol F epoxy resin, an aliphatic amine and an amine functional adduct of ethylene diamine and an epoxy resin, and a mixture thereof; and wherein the additives are selected from the group consisting of particulate impact modifier, auxiliary impact modifier, auxiliary toughening agent, diluent, adhesion promoter, filler, thixotrope, air release agent, adjuvant, 2-furanmethanol, benzyl alcohol, and combinations thereof;

wherein the electrical device is suitable for use in Division 1 hazardous locations.

7. The electrical device of claim 6, comprising a wire disposed through the aperture and the mixed two part, epoxy composition.

8. The electrical device of claim 6, wherein the two part, epoxy composition is cured and the electrical device is compliant with UL 674.

9. A method of using an epoxy composition to seal an electrical device, comprising providing an electrical device having a housing enclosing an interior space and having an exterior surface, the exterior surface defining an aperture providing communication into and out of the interior space;

providing the epoxy composition of claim 6;

mixing the epoxy resin component and the curing agent component to form a mixed epoxy composition;

disposing the mixed epoxy composition of claim 6 into the housing aperture;

exposing the mixed epoxy composition to conditions appropriate to cure the epoxy composition to form cured reaction products in the housing aperture;

wherein the cured reaction products seal the housing interior space and the electrical device is suitable for use in Division 1 hazardous locations.

10. The method of claim 9, comprising a wire disposed through the aperture and the cured reaction products.

11. The method of claim 9, wherein the electrical device is compliant with UL 674.

12. The electrical device of claim 6, wherein the epoxy composition mixture does not include a bisphenol A epoxy resin.

13. The electrical device of claim 6, wherein the epoxy composition mixture is self leveling.

14. The electrical device of claim 6, selected from an electrical motor, an electrical generator, an electrical panel, an electrical raceway and an electrical junction.

15. The two part, epoxy composition of claim 6 wherein at least one of the epoxy resin component or the curing agent component includes 2-furanmethanol.

* * * * *